US012745596B2

(12) United States Patent
Lin et al.

(10) Patent No.: US 12,745,596 B2
(45) Date of Patent: Sep. 22, 2026

(54) RETAINING RING FOR CHEMICAL-MECHANICAL POLISHING

(71) Applicant: Taiwan Semiconductor Manufacturing Company, Ltd., Hsinchu (TW)

(72) Inventors: Jeng-Chi Lin, Hsinchu (TW); Chi-hsiang Shen, Tainan (TW); Te-Chien Hou, Kaohsiung (TW); Tang-Kuei Chang, Tainan (TW); Chi-Jen Liu, Taipei (TW); Hui-Chi Huang, Hsinchu (TW); Kei-Wei Chen, Tainan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 450 days.

(21) Appl. No.: 18/334,955

(22) Filed: Jun. 14, 2023

(65) Prior Publication Data

US 2024/0420978 A1 Dec. 19, 2024

(51) Int. Cl.

| | |
|---|---|
| ***H10P 72/10*** | (2026.01) |
| ***B24B 37/32*** | (2012.01) |
| ***B24B 57/02*** | (2006.01) |
| ***H10P 52/40*** | (2026.01) |
| ***H10P 72/00*** | (2026.01) |

(52) U.S. Cl.
CPC .......... *H10P 72/1912* (2026.01); *B24B 37/32* (2013.01); *B24B 57/02* (2013.01); *H10P 52/402* (2026.01); *H10P 52/403* (2026.01); *H10P 72/0428* (2026.01)

(58) Field of Classification Search
CPC ........... H01L 21/6735; H01L 21/30625; H01L 21/3212; H01L 21/67092; B24B 37/10; B24B 37/30; B24B 37/32; B24B 57/00; B24B 57/02; H10P 52/402; H10P 52/403;
(Continued)

(56) References Cited

U.S. PATENT DOCUMENTS 5,597,346 A * 1/1997 Hempel, Jr. .......... B24B 53/017
451/36
5,695,392 A * 12/1997 Kim ........................ B24B 57/02
451/286

(Continued)

FOREIGN PATENT DOCUMENTS

| | | | |
|---|---|---|---|
| CN | 115958523 | A | 4/2023 |
| TW | 567117 | B | 12/2003 |
| TW | 202206226 | A | 2/2022 |

*Primary Examiner* — Carlos A. Rivera
(74) *Attorney, Agent, or Firm* — Ingrassia Fisher & Lorenz, LLP | IF&L

(57) ABSTRACT

Provided is a chemical-mechanical polishing apparatus, a retaining ring for a chemical-mechanical polishing apparatus, and a chemical-mechanical polishing method. A chemical-mechanical polishing apparatus includes a polishing pad; a polishing head configured to receive a wafer and to hold the wafer against the polishing pad; and a retaining ring configured to engage with the polishing head, wherein the retaining ring is formed with channels configured for flowing a slurry in a flow direction from outside the retaining ring to inside the retaining ring, wherein the channels have a cross-sectional flow area that decreases in the flow direction.

19 Claims, 13 Drawing Sheets

(58) Field of Classification Search
CPC ... H10P 52/72; H10P 52/1912; H10P 52/0428
See application file for complete search history.

(56) References Cited

U.S. PATENT DOCUMENTS

| | | | | |
|---|---|---|---|---|
| 6,443,826 | B1 | 9/2002 | Yang et al. | |
| 6,527,624 | B1 * | 3/2003 | Tolles | B24B 37/30 451/384 |
| 8,858,302 | B2 * | 10/2014 | Kim | B24B 37/32 451/364 |
| 11,691,244 | B2 | 7/2023 | Swedek | |

* cited by examiner 400
301
302
555
60

555
301
401
303
304
L1
402
302
60
400

RETAINING RING FOR CHEMICAL-MECHANICAL POLISHING

BACKGROUND

Semiconductor or integrated circuit (IC) devices are constructed using complex fabrication processes that form a plurality of different layers on top of one another. Many of the layers are patterned using photolithography, in which a light sensitive photoresist material is selectively exposed to light. For example, photolithography is used to define back-end metallization layers that are formed on top of one another. To ensure that the metallization layers are formed with a good structural definition, the patterned light must be properly focused. To properly focus the pattered light, a workpiece must be substantially planar to avoid depth of focus problems.

Chemical mechanical polishing (CMP) is a widely used process by which both chemical and mechanical forces are used to globally planarize a semiconductor workpiece. The planarization prepares the workpiece for the formation of a subsequent layer. A typical CMP tool includes a rotating platen covered by a polishing pad. A slurry distribution system is configured to provide a polishing mixture, having chemical and abrasive components, to the polishing pad. A workpiece is then brought into contact with the rotating polishing pad to planarize the workpiece. CMP is a favored process because it achieves global planarization across the entire wafer surface. The CMP process polishes and removes materials from the wafer, and works on multi-material surfaces. Furthermore, the CMP process avoids the use of hazardous gasses, and/or is usually a low-cost process.

BRIEF DESCRIPTION OF THE DRAWINGS

Aspects of the present disclosure are best understood from the following detailed description when read with the accompanying figures. It should be noted that, in accordance with the standard practice in the industry, various features may not be drawn to scale. In fact, the dimensions of the various features may be arbitrarily increased or reduced for clarity of discussion.

DETAILED DESCRIPTION

Figure 1:
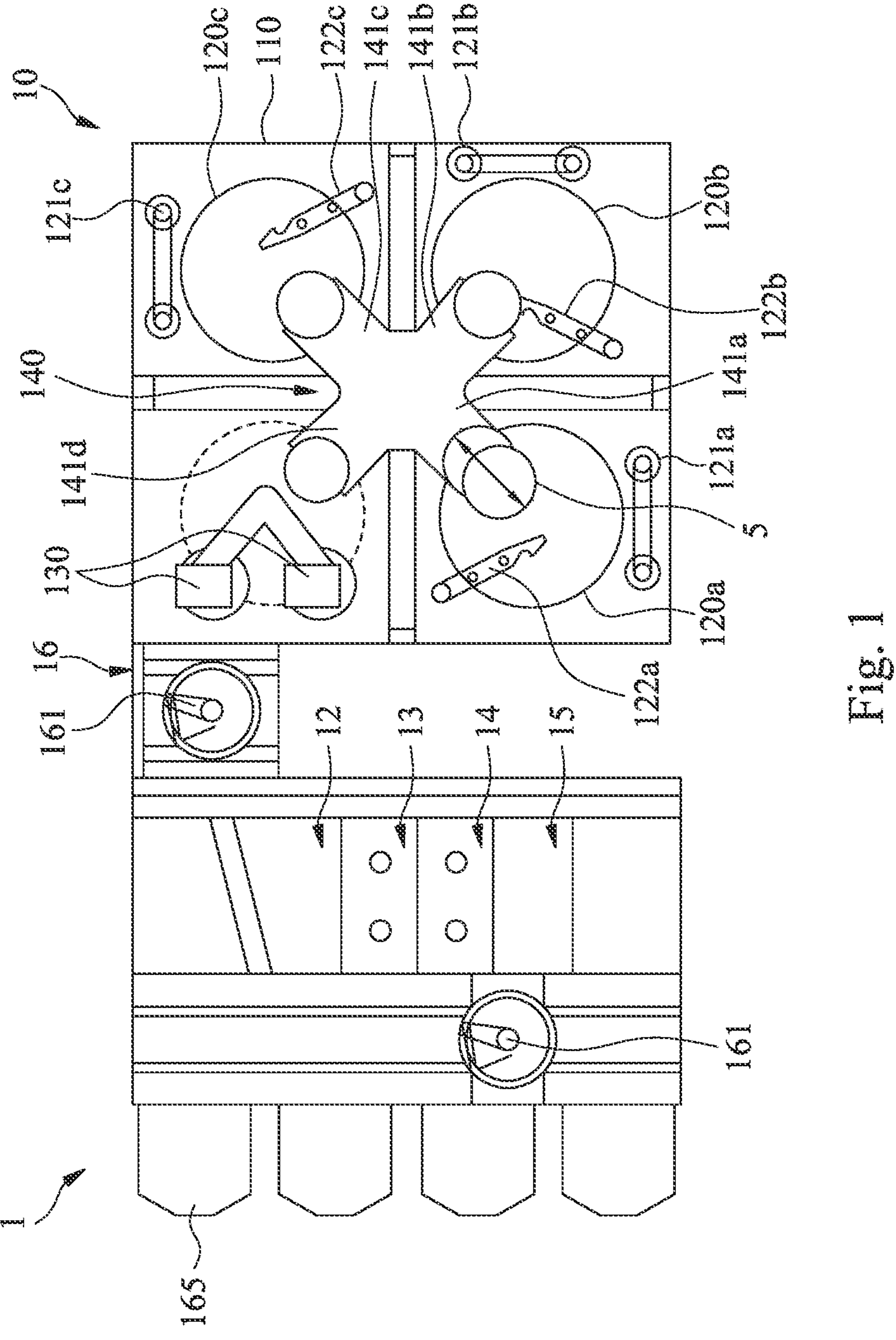
FIG. 1 is a schematic view of a Chemical Mechanical Polishing (CMP) system in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting.

For the sake of brevity, conventional techniques related to conventional semiconductor device fabrication may not be described in detail herein. Moreover, the various tasks and processes described herein may be incorporated into a more comprehensive procedure or process having additional functionality not described in detail herein. In particular, various processes in the fabrication of semiconductor devices are well-known and so, in the interest of brevity, many conventional processes will only be mentioned briefly herein or will be omitted entirely without providing the well-known process details. As will be readily apparent to those skilled in the art upon a complete reading of the disclosure, the structures disclosed herein may be employed with a variety of technologies, and may be incorporated into a variety of semiconductor devices and products. Further, it is noted that semiconductor device structures include a varying number of components and that single components shown in the illustrations may be representative of multiple components.

Furthermore, spatially relative terms, such as "over", "overlying", "above", "upper", "top", "under", "underlying", "below", "lower", "bottom", and the like, may be used herein for ease of description to describe one element's or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. When a spatially relative term, such as those listed above, is used to describe a first element with respect to a second element, the first element may be directly on the other element, or intervening elements or layers may be present. When an element or layer is referred to as being "on" another element or layer, it is directly on and in contact with the other element or layer.

In addition, the present disclosure may repeat reference numerals and/or letters in the various examples. This repetition is for the purpose of simplicity and clarity and does not in itself dictate a relationship between the various embodiments and/or configurations discussed.

Embodiments herein relate to CMP processing, and specifically to retention of the CMP slurry at the interface of the wafer and the polishing pad during CMP processing. The post-CMP profile of wafers is strongly correlated to the flow field of the slurry on the CMP platen. The flow field results from a combination of the polishing pad groove, the slurry arm performance, and the retaining ring. Herein, retaining rings are provided with grooves designed to facilitate entrance of slurry toward the wafer while inhibiting exit of the slurry away from the wafer. Therefore, slurry may be held within the retaining ring during the CMP process, providing for more efficient use of the slurry in the CMP process.

FIG. 1 is a schematic view of a processing system 1 for processing a semiconductor wafer 5, in accordance with some embodiments. In certain embodiments, the processing system 1 is a Chemical Mechanical Polishing (CMP) system. The CMP system 1 includes a CMP module or tool 10, a rinse station module 12, a number of cleaning modules, such as the cleaning modules 13 and 14, a rinsing, spinning, and/or drying module 15, and a number of transferring modules 16. The elements of the CMP system 1 can be added to or omitted, and the disclosure should not be limited by the embodiments.

The semiconductor wafer 5 may be made of silicon or other semiconductor materials. Alternatively or additionally, the semiconductor wafer 5 may include other elementary semiconductor materials such as germanium (Ge). In some embodiments, the semiconductor wafer 5 is made of a compound semiconductor such as silicon carbide (SIC), gallium arsenic (GaAs), indium arsenide (InAs), or indium phosphide (InP). In some embodiments, the semiconductor wafer 5 is made of an alloy semiconductor such as silicon germanium (SiGe), silicon germanium carbide (SiGeC), gallium arsenic phosphide (GaAsP), or gallium indium phosphide (GaInP). In some embodiments, the semiconductor wafer 5 includes an epitaxial layer. For example, the semiconductor wafer 5 has an epitaxial layer overlying a bulk semiconductor. In some other embodiments, the semiconductor wafer 5 may be a silicon-on-insulator (SOI) or a germanium-on-insulator (GOI) substrate.

The semiconductor wafer 5 may have various device elements. Examples of device elements that are formed in the semiconductor wafer 5 include transistors (e.g., metal oxide semiconductor field effect transistors (MOSFET), complementary metal oxide semiconductor (CMOS) transistors, bipolar junction transistors (BJT), high voltage transistors, high-frequency transistors, p-channel and/or n-channel field-effect transistors (PFETs/NFETs), etc.), diodes, and/or other applicable elements. Various processes are performed to form the device elements, such as deposition, etching, implantation, photolithography, annealing, and/or other suitable processes. In some embodiments, a shallow trench isolation (STI) layer, an inter-layer dielectric (ILD), or an inter-metal dielectric layer covers the device elements formed on the semiconductor wafer 5.

The CMP module 10 is configured for performing a planarization process on a semiconductor wafer 5 in a semiconductor manufacturing process. In some embodiments, the CMP module 10 includes a base 110, a number of polishing pads 120*a*, 120*b*, and 120*c*, a number of load cups 130, and a head rotation unit 140. The elements of the CMP module 10 can be added to or omitted, and the disclosure should not be limited by the embodiments.

In some embodiments, the polishing pads 120*a*, 120*b*, and 120*c* are provided on the base 110. The three polishing pads 120*a*, 120*b* and 120*c* facilitate simultaneous processing of multiple wafers in a short time. Each of the polishing pads is mounted on a rotatable carousel (not shown in the figures). Pad conditioners 121*a*, 121*b* and 121*c* are provided on the base 110 and can be swept over the respective polishing pads 120*a*, 120*b* and 120*c* for conditioning of the polishing pads 120*a*, 120*b* and 120*c*. Slurry supply arms 122*a*, 122*b* and 122*c* are further provided on the base 110 for supplying slurry to the surfaces of the respective polishing pads 120*a*, 120*b* and 120*c*.

The load cups 130 are configured for the loading and unloading of semiconductor wafers 5. In some embodiments, each the load cup 130 includes a circular pedestal on which the semiconductor wafer 5 is placed for loading the semiconductor wafer 5 onto the polishing pads 120*a*, 120*b* and 120*c*, and for unloading the semiconductor wafer 5 from the polishing pad 120*a*. 120*b* and 120*c*.

The head rotation unit 140 has a number of carrier or polishing heads 141*a*, 141*b*, 141*c*, and 141*d* for holding and fixedly rotating the semiconductor wafers 5 on the polishing pads 120*a*. 120*b* and 120*c*. The polishing heads 141*a*, 141*b*, 141*c*, and 141*d* of the head rotation unit 140 are mounted on respective rotation shafts (not shown in the figures) which are rotated by a driving mechanism inside the head rotation unit 140. The polishing heads 141*a*, 141*b*, 141*c*, and 141*d* hold respective semiconductor wafers 5 and press the semiconductor wafers 5 against the top surfaces of the respective polishing pads 120*a*. 120*b* and 120*c*. In this manner, material layers are removed from the respective semiconductor wafers 5.

The transferring module 16 includes one or more driving elements (not shown in figures) and a number of robot arms 161, in accordance with some embodiments. The driving element, such as a motor, is controlled by a control module and is coupled to the robot arms 161. The robot arms 161 are driven by the driving element to provide both radial and rotational movement in a fixed plane to pick up, transfer, and deliver the semiconductor wafer 5 from one location within the CMP system 1 to another. For example, with the transferring module 16, the semiconductor wafer 5 is transferred between a carrier 165, such as a FOUP, and the CMP module 10. Alternatively, the semiconductor wafer 5 is transferred between the CMP module 10 and the rinse station module 12 by the transferring module 16. Alternatively, the semiconductor wafer 5 is transferred between the rinsing, spinning, and/or drying module 15 and the carrier 165.

Figure 2:
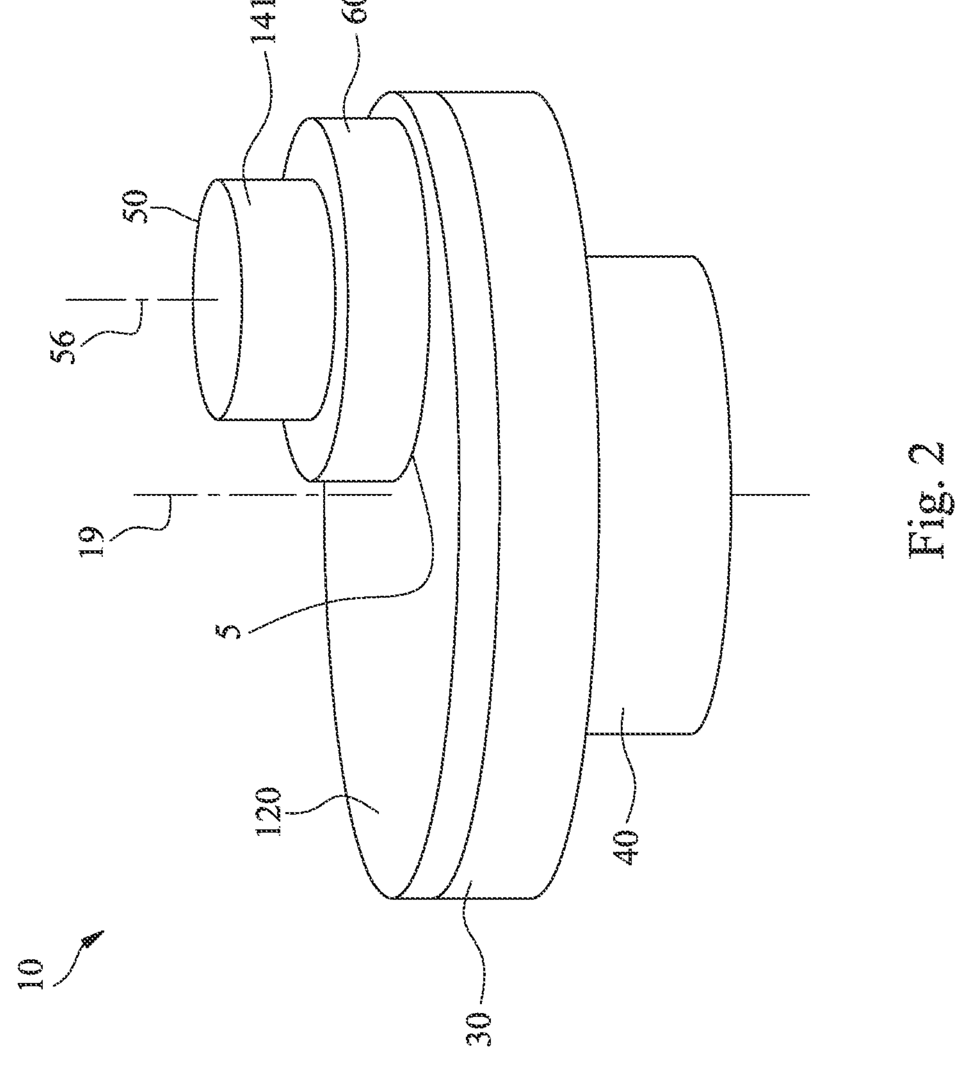
FIG. 2 is a perspective view of a CMP tool of the system of FIG. 1 in accordance with some embodiments.

FIG. 2 is a schematic view of a Chemical Mechanical Polishing (CMP) polish tool or module 10, such as from the system 1 of FIG. 1. The tool 10 is configured for performing a CMP process on a wafer 5 in a semiconductor manufacturing process. As shown, the tool 10 includes a polishing pad 120, a platen 30, a platen motor 40, and a wafer holder assembly 50, in accordance with some embodiments. The elements of the polish tool 10 can be added to or omitted, and the disclosure should not be limited by the embodiments.

The platen 30 is configured to receive and rotate the polishing pad 120 about a center axis 19. In some embodiments, the platen 30 is circular in shape. The diameter of the platen 30 lies in a range that is substantially larger than the diameter of a wafer 5 to be polished.

The platen motor 40 rotates the platen 30 about the axis 19. The platen motor 40 may be electrically connected to a control module in the CMP tool and may be actuated and operated by the control module.

In an embodiment, the polishing pad 120 is fixed onto the platen 30. The polishing pad 120 may be a consumable item used in a semiconductor wafer fabrication process. The polishing pad 120 may be a hard, incompressible pad or a soft pad. For oxide polishing, hard and stiffer pads are generally used to achieve planarity. Softer pads are generally used in other polishing processes to achieve improved uniformity and a smooth surface. Hard pad and soft pad components may also be combined in an arrangement for customized applications.

The wafer holder assembly 50 is used to support the wafer 5. In some embodiments, the wafer holder assembly 50 may include a shaft with a driving motor (not shown), a carrier head 141, and a retaining ring 60. The driving motor may be configured to control rotational movement of the carrier head 141 and retaining ring 60 about a rotation axis 56. The rotation axis 56 is different from the rotation axis 19. In some embodiments, the driving motor is an electric motor which converts electrical energy into mechanical energy for driving the rotation of the carrier head 141 and retaining ring 60. In some embodiments, the carrier head 141 and retaining ring 60 are driven to rotate about the rotation axis 56 by an external force (e.g., frictional force generated between the polishing pad 120 and the wafer 5).

Figure 3:
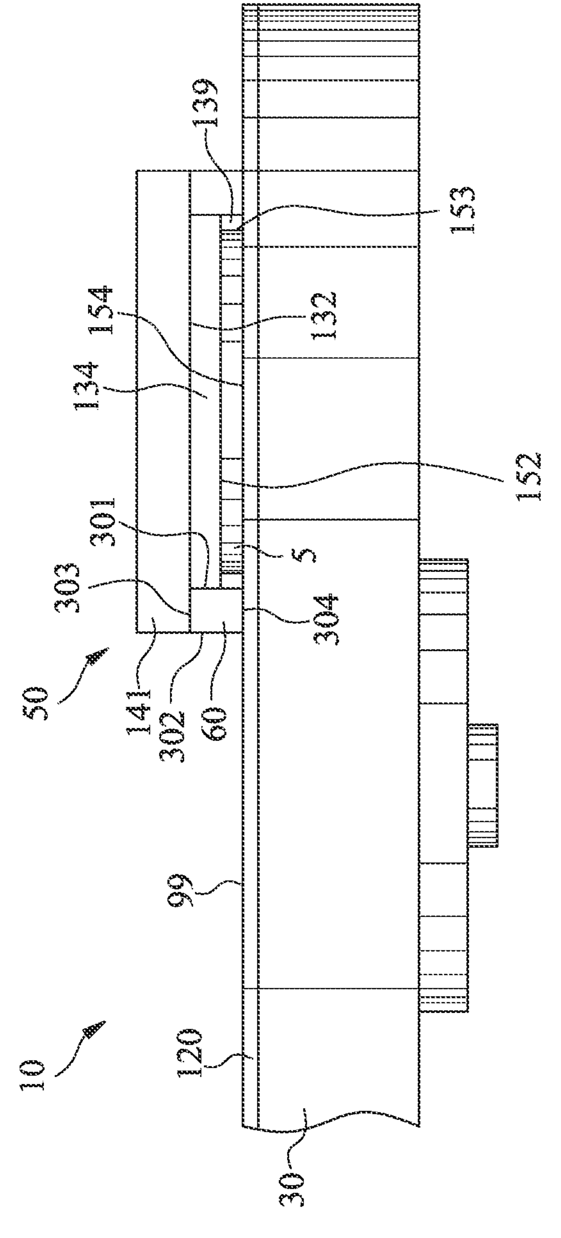
FIG. 3 is a cross-sectional view of the CMP tool of FIG. 2 in accordance with some embodiments.

FIG. 3 provides a cross-sectional view of the wafer holder assembly 50 and polishing pad 120 of FIG. 2 during a CMP process. As shown, a slurry 99 is delivered to the polishing pad 120.

Further, the wafer 5 is located under the wafer holder assembly 50. In some embodiments, wafer 5 is attached to a resilient member 134 (e.g., a backing film) positioned between wafer 5 and lower surface 132 of carrier head 141. Specifically, a backside 152 of the wafer 5 is attached to the resilient member 134. Further, the wafer 5 has a front side 154 to be polished by the slurry 99 and polishing pad 120. As shown, the wafer 5 is generally cylindrical and has an outer peripheral edge 153.

In the illustrated embodiment, the retaining ring 60 is formed as an annular wall having an inner surface 301 and an outer surface 302. As shown, the retaining ring 60 extends downward from a top surface 303 abutting the carrier head 141 to a bottom surface 304. As shown in FIG. 3, the bottom surface 304 of the retaining ring 60 may contact the polishing pad 120. The retaining ring 60 defines an internal volume 139 which receives the wafer 5. As shown, the inner surface 301 of the retaining ring 60 may be distanced from the outer peripheral edge 153 of the wafer 5. By surrounding the wafer 5, the retaining ring 60 ensures that the wafer 5 remains underneath the carrier head 141 during the polishing process.

During operation of CMP tool 10, wafer 5 is positioned face-downward with front side 154 against polishing pad 120. As wafer 5 moves, polishing pad 120 and slurry 99 remove material from front side 154. The retaining ring 60 may be pressed against polishing pad 120 by an adjustable down-force.

Embodiments herein facilitate entrance of slurry 99 into the internal volume 139 where the wafer 5 is located. Further, embodiment herein inhibit exit of slurry 99 from the internal volume 139 where the wafer 5 is located. Therefore, slurry 99 may be trapped in the internal volume 139 during the CMP process, providing for more efficient use of the slurry 99 in the CMP process.

Figures 4, 5:
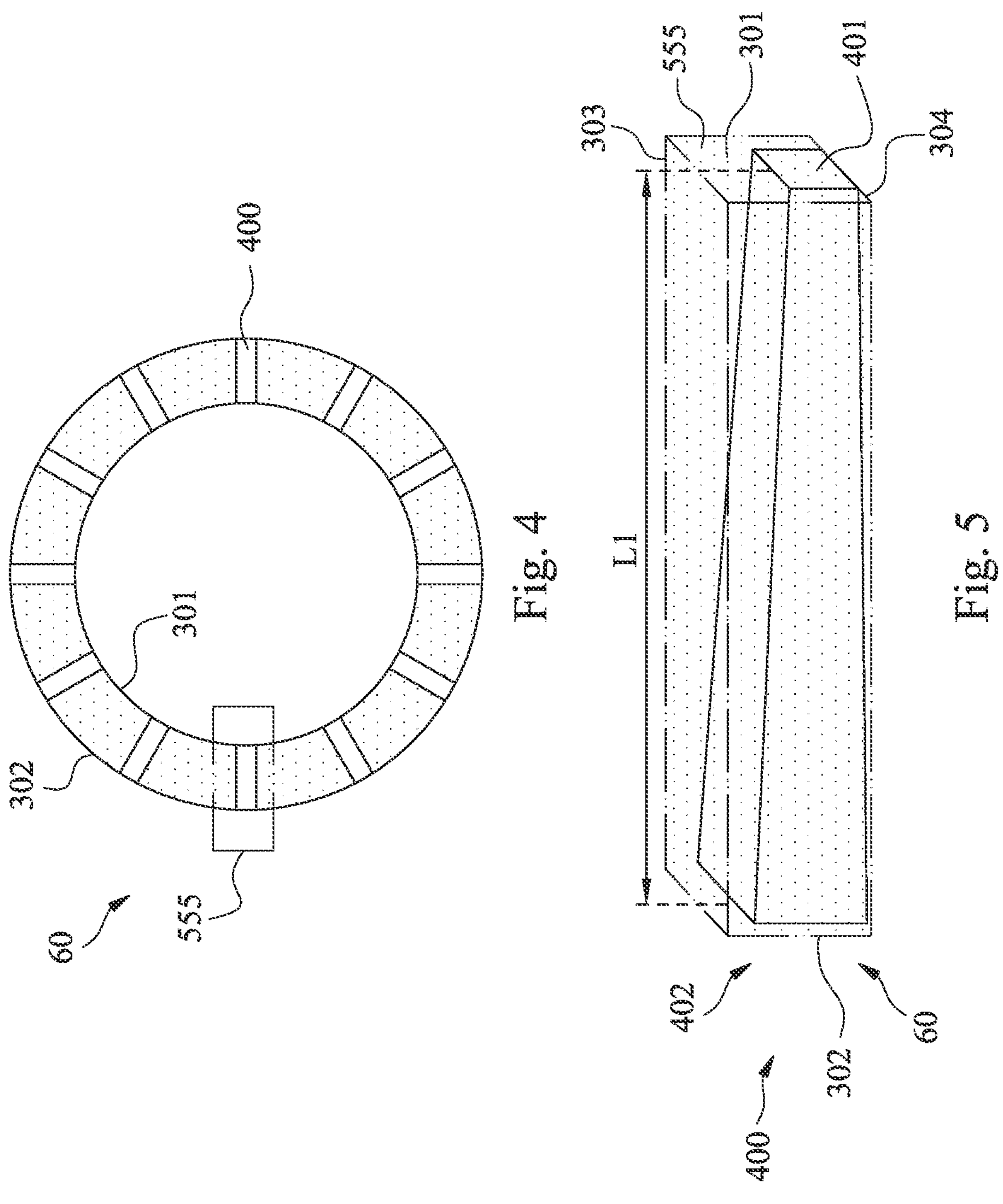
FIG. 4 is an overhead schematic view of the retaining ring of the tool of FIGS. 2 and 3 in accordance with some embodiments.
FIG. 5 is a perspective view of a portion of the retaining ring of FIG. 4 in accordance with some embodiments.

Referring now to FIG. 4, an overhead view of the retaining ring 60 is provided. As shown, the retaining ring 60 includes channels 400 extending from the outer surface 302 to the inner surface 301 of the retaining ring. While the retaining ring 60 is shown as including twelve channels 400, any suitable number of channels 400 may be used. Further, it is noted that the top surface 303 of the retaining ring 60 is transparent in FIG. 4, to allow for viewing of the channels 400.

Figure 7:
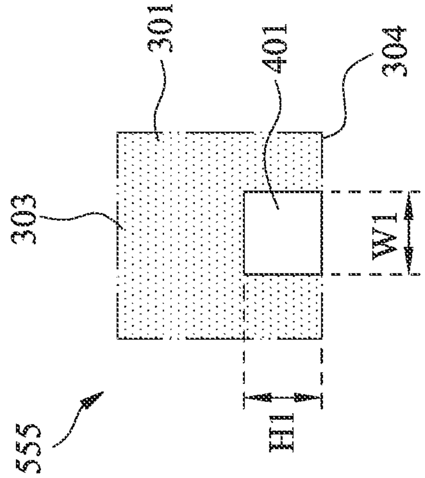
FIG. 7 is a view of the inner side of the portion of the retaining ring of FIG. 5 in accordance with some embodiments.
Figure 6:
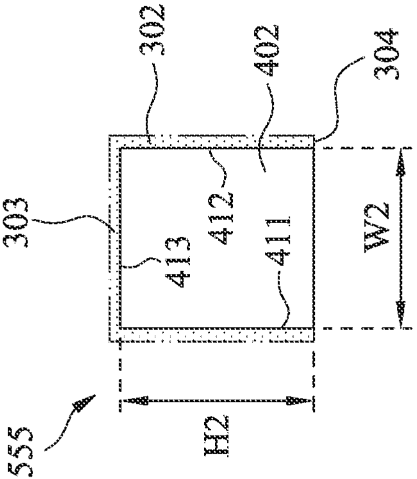
FIG. 6 is a view of the outer side of the portion of the retaining ring of FIG. 5 in accordance with some embodiments.

FIG. 5 provides a perspective view of a portion 555 of the retaining ring 60 of FIG. 4, with the internal channel 400 being visible through the retaining ring 60. As shown, portion 555 includes a channel 400 extending from the outer surface 302 to the inner surface 301 of the retaining ring 60. FIG. 6 is a side view of the outer surface 302 of the retaining ring 60 in portion 555. FIG. 7 is a side view of the inner surface 301 of the retaining ring 60 in portion 555.

Cross-referencing FIGS. 5, 6 and 7, it may be seen that the channel 400 forms an outer opening 402 at the outer surface 302 and forms an inner opening 401 at the inner surface 301. Further, the channel 400 is in fluid communication with the bottom surface 304, such that the bottom end of the channel 400 is not bound by the retaining ring 60. Rather, the channel 400 is defined by a first sidewall 411, a second sidewall 412, and an upper wall 413.

As shown, the channel 400 has a radial length L1 from outer opening 402 to the inner opening 401. Length L1 may be from 0.5 to 50 millimeters (mm). For example, length L1 may be at least 0.5, at least 1, at least 2, at least 5, at least 10, at least 15, at least 20, at least 25, at least 30, at least 35, at least 40, or at least 45 millimeters (mm). Further, length L1 may be at most 1, at most 2, at most 5, at most 10, at most 15, at most 20, at most 25, at most 30, at most 35, at most 40, at most 45, or at most 50 millimeters (mm).

As shown, the channel 400 has a cross-sectional flow area that decreases from the outer surface 302 to the inner surface 301. In the embodiment of FIGS. 5, 6, and 7, the cross-sectional flow area decreases continuously, i.e., in a smooth fashion. At opening 402, the channel 400 has a width W2 extending from sidewall 411 to sidewall 412. Further, at opening 402, the channel 400 has a height H2 extending from the bottom surface 304 to the upper wall 413. As a result, at opening 402, the channel 400 has a cross-sectional flow area A2 equal to the product of width W2 and height H2.

At opening 401, the channel 400 has a width W1 extending from sidewall 411 to sidewall 412. Further, at opening 401, the channel 400 has a height H1 extending from the bottom surface 304 to the upper wall 413. As a result, at opening 401, the channel 400 has a cross-sectional flow area A1 equal to the product of width W1 and height H1.

In some embodiments, the maximum cross-sectional flow area of the channel 400 is cross-sectional flow area A2 at the opening 402. In some embodiments, the minimum cross-sectional flow area of the channel 400 is cross-sectional flow area A1 at the opening 401.

In some embodiments, the maximum cross-sectional flow area is from 5 to 500 millimeters (mm). For example, the maximum cross-sectional flow area may be at least 5, at least 10, at least 25, at least 50, at least 100, at least 150, at least 200, at least 250, at least 300, at least 350, at least 400, or at least 450 millimeters (mm). Further, the maximum cross-sectional flow area may be at most 10, at most 25, at most 50, at most 100, at most 150, at most 200, at most 250, at most 300, at most 350, at most 400, at most 450, or at most 500 millimeters (mm).

In some embodiments, the minimum cross-sectional flow area is from 5% to 95% of the maximum cross-sectional flow area. For example, the minimum cross-sectional flow area may be at least 5%, at least 10%, at least 15%, at least 20%, at least 25%, at least 30%, at least 35%, at least 40%, at least 45%, at least 50%, at least 55%, at least 60%, at least 65%, at least 70%, at least 75%, at least 80%, at least 85%, or at least 90% of the maximum cross-sectional flow area. Further, the minimum cross-sectional flow area may be at most 10%, at most 15%, at most 20%, at most 25%, at most 30%, at most 35%, at most 40%, at most 45%, at most 50%, at most 55%, at most 60%, at most 65%, at most 70%, at most 75%, at most 80%, at most 85%, at most 90%, or at most 95% of the maximum cross-sectional flow area.

The flow amount of slurry 99 (FIG. 3) that may pass through the channel 400 from the outer opening 402 to the inner opening 401 is equal to the product of the cross-sectional flow area of the channel and the flow speed. During a CMP process, the slurry supply arm 122 (FIG. 1) supplies a fixed flow amount of slurry 99 (FIG. 3). With the reduction in cross-sectional flow area of the channel 400 from the outer opening 402 to the inner opening 401, the flow rate of the slurry must increase as the slurry travels through the channel 400. It is believed that this increase in flow rate inhibits an amount of slurry that may flow outward from the inner opening 401 to the outer opening 402. As a result, slurry is trapped within the retaining ring 60.

While FIG. 5 illustrates a channel having a rectangular cross-sectional flow area that continuously decreases other embodiments are contemplated.

Figure 8:
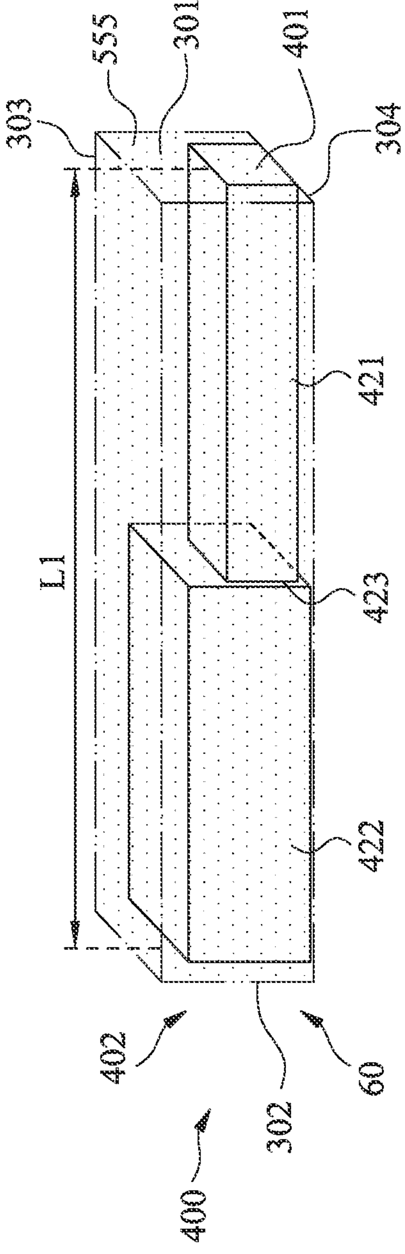
FIG. 8 is a perspective view of a portion of the retaining ring of FIG. 4 in accordance with some embodiments.

For example, FIG. 8 illustrates another embodiment of the portion 555 of the retaining ring 60 of FIG. 4. Similar to FIG. 5, FIG. 8 illustrates internal channel 400 being visible through the retaining ring 60. In FIG. 8, the channel 400 has a steady cross-sectional flow area from the outer opening 402 through an outer portion 422. Likewise, the channel 400 has a steady cross-sectional flow area from the inner opening 401 through an inner portion 421. At the interface 423 between the outer portion 422 and the inner portion 421, the cross-sectional flow area changes sharply, i.e., in a step-wise manner, from the maximum cross-sectional flow area of the outer opening 402 to the minimum cross-sectional flow area of the inner opening 401. The maximum and minimum cross-sectional flow areas and other dimensions of the embodiment of FIG. 8 may be the same as described above.

Figures 9, 10, 11:
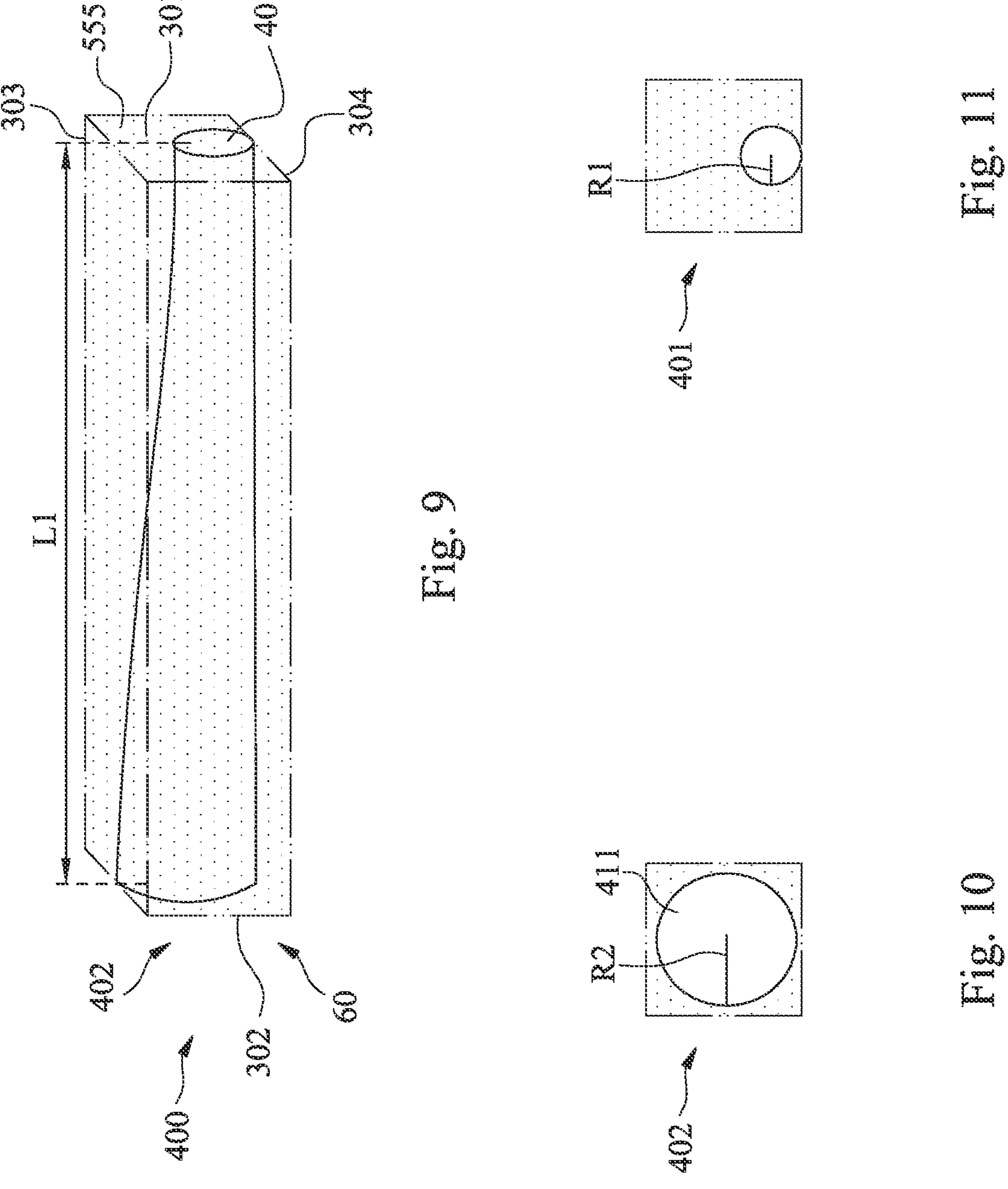
FIG. 9 is a perspective view of a portion of the retaining ring of FIG. 4 in accordance with some embodiments.
FIG. 10 is a view of the outer side of the portion of the retaining ring of FIG. 9 in accordance with some embodiments.
FIG. 11 is a view of the inner side of the portion of the retaining ring of FIG. 9 in accordance with some embodiments.

FIGS. 9, 10 and 11 illustrate another embodiment of the portion 555 of the retaining ring 60 of FIG. 4. FIG. 9 provides a perspective view of a portion 555 of the retaining ring 60 of FIG. 4, with the internal channel 400 being visible through the retaining ring 60. As shown, portion 555 includes a channel 400 extending from the outer surface 302 to the inner surface 301 of the retaining ring 60. FIG. 10 is a side view of the outer surface 302 of the retaining ring 60 in portion 555. FIG. 11 is a side view of the inner surface 301 of the retaining ring 60 in portion 555.

In FIGS. 9, 10 and 11, the channel 400 has a circular cross-sectional flow area that decreases smoothly from outer opening 402 to inner opening 401. At opening 402, the channel 400 has a radius R2. As a result, at opening 402, the channel 400 has a cross-sectional flow area A2 equal to the product of $\Pi(R2)^2$. At opening 401, the channel 400 has a radius R1. As a result, at opening 401, the channel 400 has a cross-sectional flow area A1 equal to the product of $\Pi(R1)^2$.

The maximum and minimum cross-sectional flow areas and other dimensions of the embodiment of FIGS. 9, 10, and 11 may be the same as described above.

In some embodiments, the maximum cross-sectional flow area of the channel 400 is cross-sectional flow area A2 at the opening 402. In some embodiments, the minimum cross-sectional flow area of the channel 400 is cross-sectional flow area A1 at the opening 401.

In some embodiments, the maximum cross-sectional flow area is from 5 to 500 millimeters (mm). For example, the maximum cross-sectional flow area may be at least 5, at least 10, at least 25, at least 50, at least 100, at least 150, at least 200, at least 250, at least 300, at least 350, at least 400, or at least 450 millimeters (mm). Further, the maximum cross-sectional flow area may be at most 10, at most 25, at most 50, at most 100, at most 150, at most 200, at most 250, at most 300, at most 350, at most 400, at most 450, or at most 500 millimeters (mm).

In some embodiments, the minimum cross-sectional flow area is from 5% to 95% of the maximum cross-sectional flow area. For example, the minimum cross-sectional flow area may be at least 5%, at least 10%, at least 15%, at least 20%, at least 25%, at least 30%, at least 35%, at least 40%, at least 45%, at least 50%, at least 55%, at least 60%, at least 65%, at least 70%, at least 75%, at least 80%, at least 85%, or at least 90% of the maximum cross-sectional flow area. Further, the minimum cross-sectional flow area may be at most 10%, at most 15%, at most 20%, at most 25%, at most 30%, at most 35%, at most 40%, at most 45%, at most 50%, at most 55%, at most 60%, at most 65%, at most 70%, at most 75%, at most 80%, at most 85%, at most 90%, or at most 95% of the maximum cross-sectional flow area.

The flow amount of slurry 99 (FIG. 3) that may pass through the channel 400 from the outer opening 402 to the inner opening 401 is equal to the product of the cross-sectional flow area of the channel and the flow speed. During a CMP process, the slurry supply arm 122 (FIG. 1) supplies a fixed flow amount of slurry 99 (FIG. 3). With the reduction in cross-sectional flow area of the channel 400 from the outer opening 402 to the inner opening 401, the flow rate of the slurry must increase as the slurry travels through the channel 400. It is believed that this increase in flow rate inhibits an amount of slurry that may flow outward from the inner opening 401 to the outer opening 402. As a result, slurry is trapped within the retaining ring 60.

Figure 12:
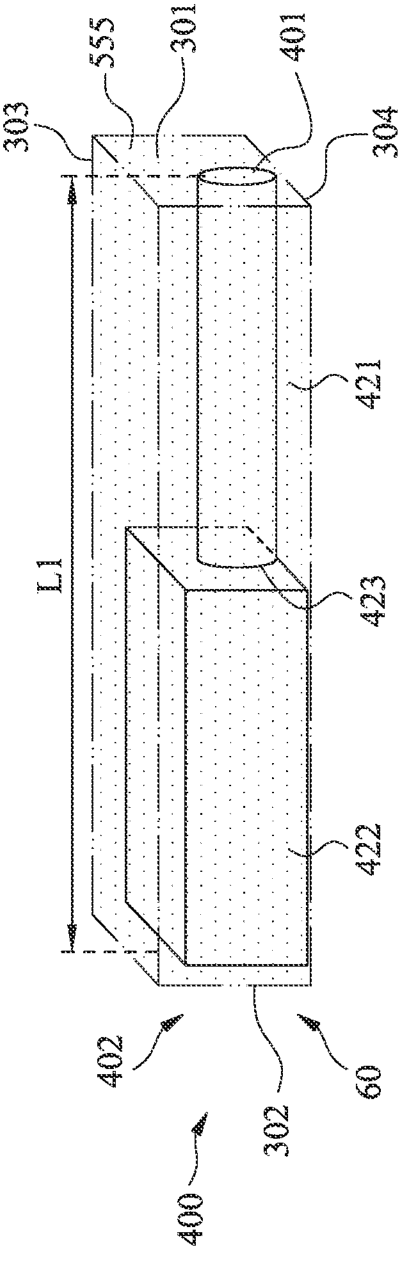
FIG. 12 is a perspective view of a portion of the retaining ring of FIG. 4 in accordance with some embodiments.

Referring now to FIG. 12, another embodiment of portion 555 of retaining ring 60 with channel 400 is illustrated. Similar to FIG. 5, FIG. 12 illustrates internal channel 400 being visible through the retaining ring 60. In FIG. 12, the channel 400 has a steady cross-sectional flow area from the outer opening 402 through an outer portion 422. Likewise, the channel 400 has a steady cross-sectional flow area from the inner opening 401 through an inner portion 421. At the interface 423 between the outer portion 422 and the inner portion 421, the cross-sectional flow area changes sharply, i.e., in a step-wise manner, from the maximum cross-sectional flow area of the outer opening 402 to the minimum cross-sectional flow area of the inner opening 401. As shown in FIG. 12, the outer portion 422 of the channel 400 has a rectangular cross-sectional flow area and the inner portion 421 has a circular cross-sectional flow area. The maximum and minimum cross-sectional flow areas and other dimensions of the embodiment of FIG. 12 may be the same as described above.

Figures 13, 14, 15, 16:
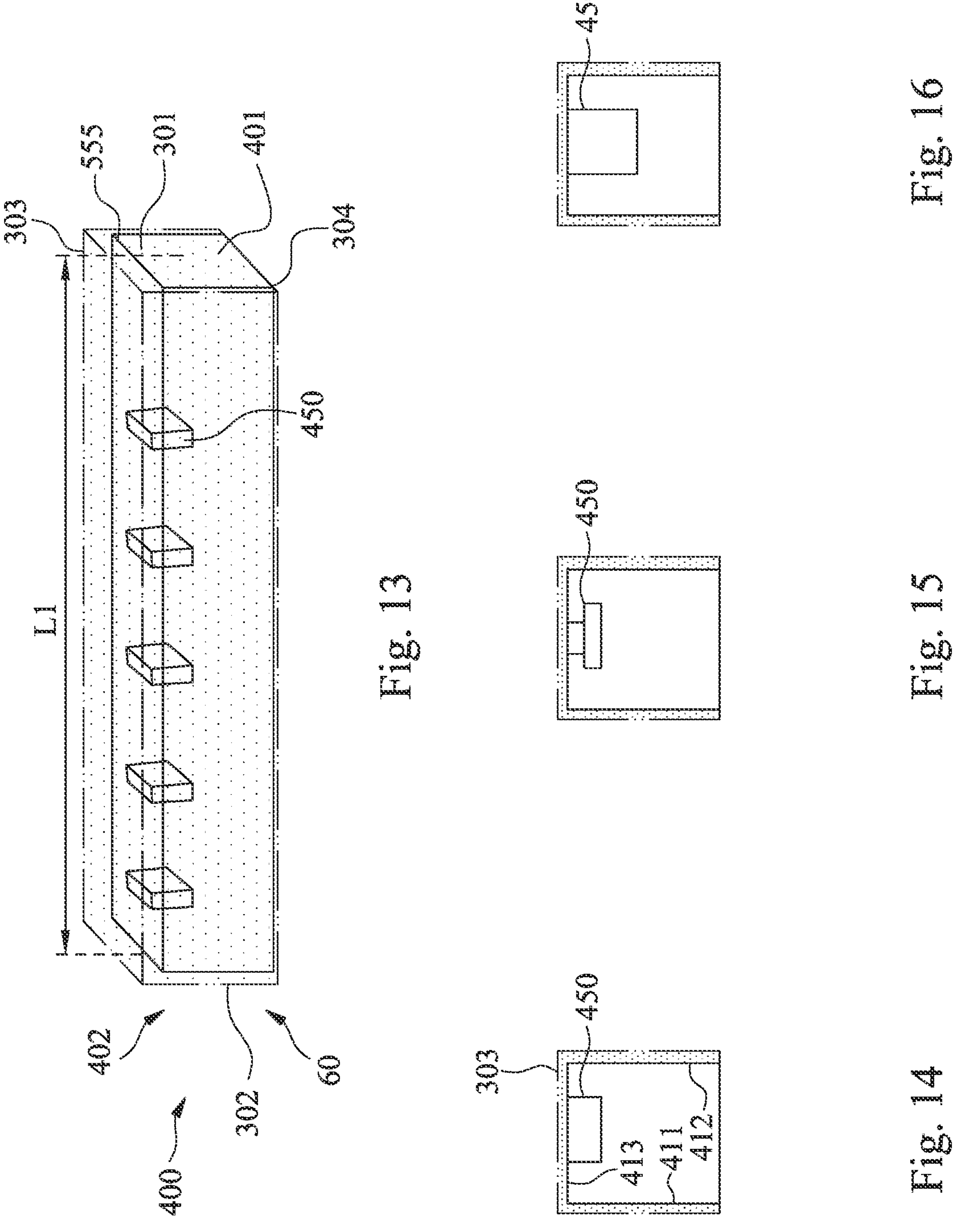
FIG. 13 is a perspective view of a portion of the retaining ring of FIG. 4 in accordance with some embodiments.
FIGS. 14-16 are cross-sectional views of alternative embodiments of the portion of the retaining ring of FIG. 13, taken through a baffle.

FIG. 13 provides a perspective view of another embodiment of portion 555 of retaining ring 60 with channel 400. Similar to FIG. 5, FIG. 13 illustrates internal channel 400 being visible through the retaining ring 60. In FIG. 13, the channel 400 is formed with constant-sized sidewalls 411 and 412 and upper wall 413. However, baffles 450 are located in the channel 400 to provide constrictions reducing the cross-sectional flow area. In such embodiments, the cross-sectional flow area is equal to the difference of the area of the channel (product of width and height) and the area of the baffle (product of width and height). In FIG. 13, the baffles 450 are arranged periodically, and are equidistantly sized from one another along the length L1 of the channel 400; however, other arrangements are contemplated.

FIGS. 14, 15, and 16 illustrate different embodiments of the channel 400 of FIG. 13. FIGS. 14, 15, and 16 provide cross-sectional views taken through a respective baffle to illustrate the cross-sectional flow area. In each embodiment, the baffle 450 is connected to the upper wall 413, through other arrangements are contemplated. In FIG. 14, the baffle 450 reduces the cross-sectional flow area by 10%. In the embodiment of FIG. 15, a similarly sized baffle 450 is provided with a different shape. In the embodiment of FIG. 16, the baffle 450 reduces the cross-sectional flow area by 25%.

Figure 17:
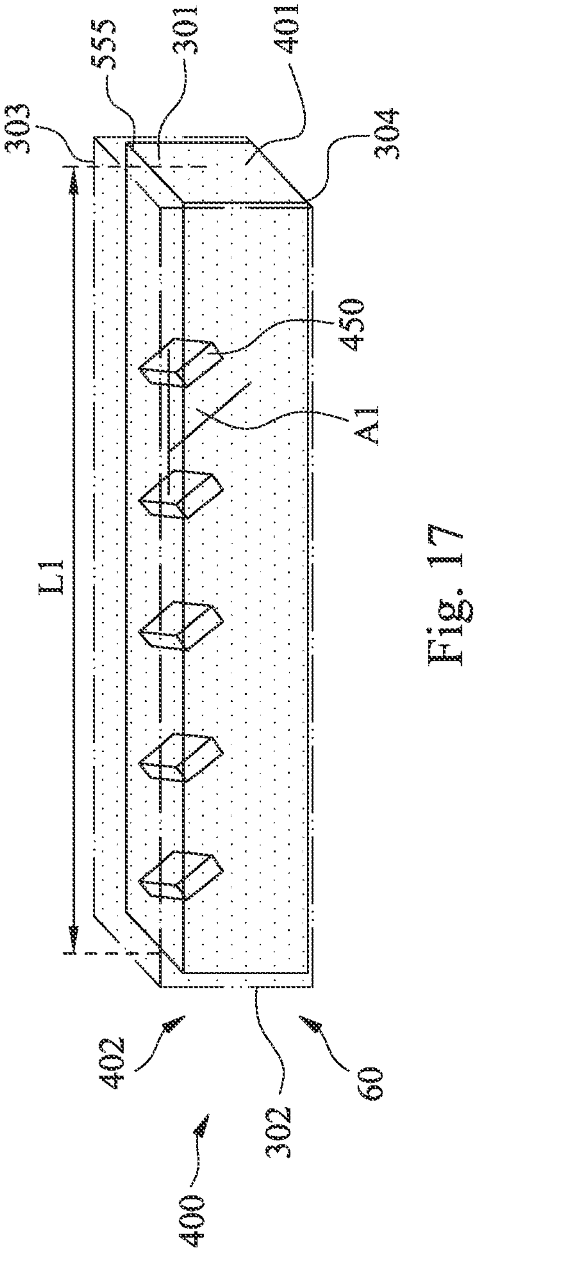
FIG. 17 is a perspective view of a portion of the retaining ring of FIG. 4 in accordance with some embodiments.
Figure 18:
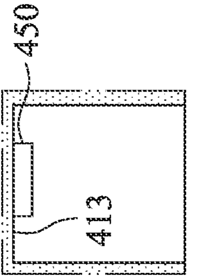
FIG. 18 is a cross-sectional views of the portion of the retaining ring of FIG. 17, taken through a baffle.

In FIGS. 13, 14, 15, and 16, the baffles 450 are arranged at a right angle to the upper wall 413. Referring to FIGS. 17 and 18, another embodiment with baffles 450 is shown.

FIG. 17 provides a perspective view of another embodiment of portion 555 of retaining ring 60 with channel 400. Similar to FIG. 5, FIG. 17 illustrates internal channel 400 being visible through the retaining ring 60. FIG. 18 provides a cross-sectional view taken through a portion of a selected baffle 450.

In FIGS. 17 and 18, baffles 450 are again used to reduce the cross-sectional flow area of the channel 400. However, the baffles 450 are mounted to the upper wall 413 at an angle A1. In some embodiments, the angle A1 is acute from the perspective of the inner opening 401, as shown.

It is contemplated that the baffles 450 be formed at an angle A1 of from 1 to 90 degrees, such as at least 1, at least 5, at least 10, at least 15, at least 20, at least 25, at least 30, at least 35, at least 40, at least 45, at least 50, at least 55, at least 60, at least 65, at least 70, at least 75, at least 80, or at least 85 degrees, and such as at most 5, at most 10, at most 15, at most 20, at most 25, at most 30, at most 35, at most 40, at most 45, at most 50, at most 55, at most 60, at most 65, at most 70, at most 75, at most 80, at most 85 degrees, or at most 90 degrees.

Figure 19:
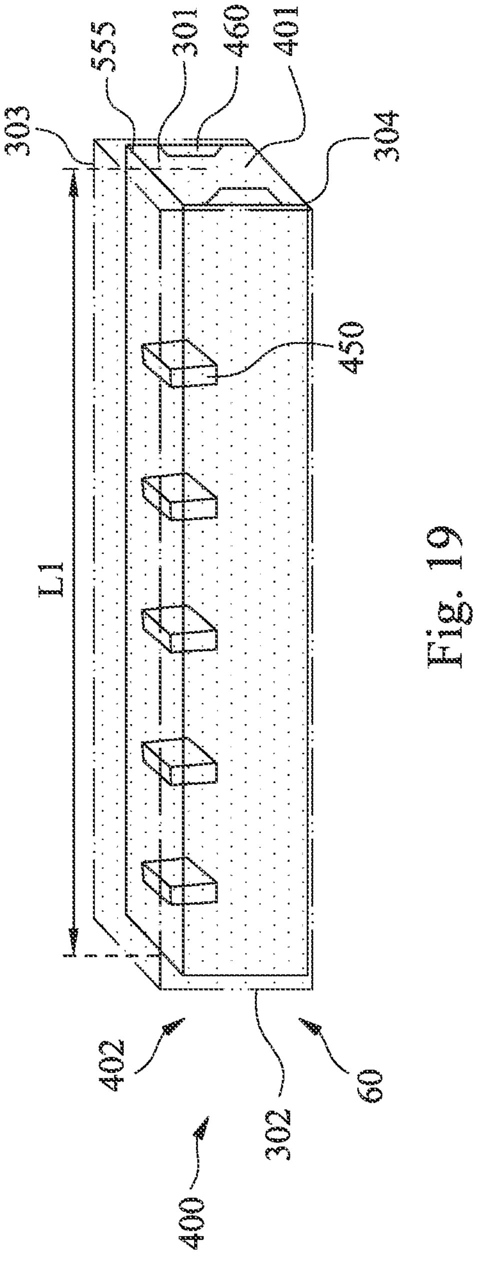
FIG. 19 is a perspective view of a portion of the retaining ring of FIG. 4 in accordance with some embodiments.
Figure 20:
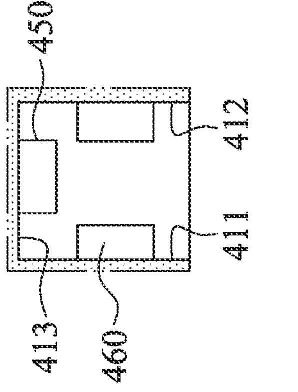
FIG. 20 is a view of the inner side of the portion of the retaining ring of FIG. 19 in accordance with some embodiments.

FIG. 19 provides a perspective view of another embodiment of portion 555 of retaining ring 60 with channel 400. Similar to FIG. 5, FIG. 19 illustrates internal channel 400 being visible through the retaining ring 60. FIG. 20 provides a side view from the inner opening 401.

In FIGS. 19 and 20, the baffles 450 are mounted to the upper wall 413. Further, side baffles 460 are mounted to the opposite sidewalls 411 and 412. In the illustrated embodiment, the baffles 450 are arranged periodically and are equidistantly spaced along length L1, while the side baffles 460 are located only at the inner opening 401. While this arrangement is illustrated, other arrangements are possible.

In the embodiments of FIGS. 13-20, each baffle 450 or 460 may have a cross-sectional area in the plane of the flow area of from 0.1 to 250 square millimeters ($mm^2$). For example, each baffle 450 or 460 may have a cross-sectional area in the plane of the flow area of at least 0.1, at least 0.5, at least 1, at least 2, at least 5, at least 10, at least 25, at least 50, at least 100, at least 150, or at least 200 square millimeters ($mm^2$), and at most 0.5, at most 1, at most 2, at most 5, at most 10, at most 25, at most 50, at most 100, at most 150, at most 200, or at most 250 square millimeters ($mm^2$).

Each baffle 450 or 460 may have a cross-sectional area in the plane of the flow area of from 1 to 50% of the cross-sectional flow area, such as at least 1, at least 5, at least 10, at least 15, at least 20, at least 25, at least 30, at least 35, at least 40, or at least 45% of the cross-sectional flow area; and at most 5, at most 10, at most 15, at most 20, at most 25, at most 30, at most 35, at most 40, at most 45, or at most 50% of the cross-sectional flow area.

Further, each baffle 450 or 460 may be formed with a length, width, or depth of from 0.5 to 50 millimeters (mm). For example, a baffle length, width, or depth may be at least 0.5, at least 1, at least 2, at least 5, at least 10, at least 15, at least 20, at least 25, at least 30, at least 35, at least 40, or at least 45 millimeters (mm), and at most 1, at most 2, at most 5, at most 10, at most 15, at most 20, at most 25, at most 30, at most 35, at most 40, at most 45, or at most 50 millimeters (mm).

The embodiments of FIGS. 5-20 provide for a reduction in cross-sectional flow area from the outer surface 302 to the inner surface 301 of the retaining ring 60. As a result, flow rate of slurry may be increased and the reverse flow of slurry, i.e., from inside the retaining ring 60 to outside the retaining ring, may be eliminated or reduced. In such embodiments, the channels 400 may be linear, such as along a radial path through the retaining ring 60.

Figure 22:
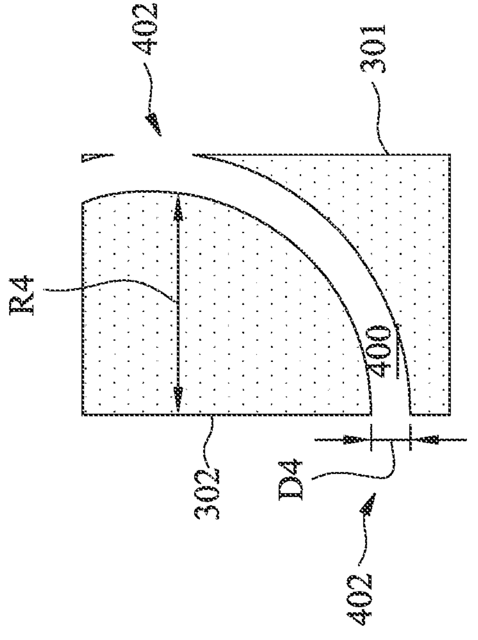
FIGS. 21-23 are overhead views of alternative embodiments of a portion of the retaining ring of FIG. 4 in accordance with some embodiments.
Figure 21:
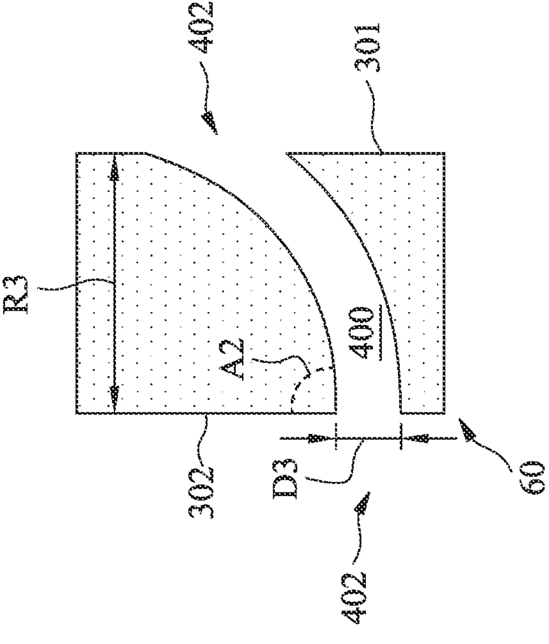
Figure 23:
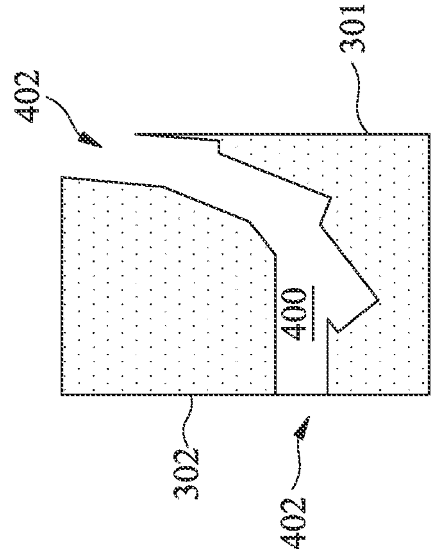

FIGS. 21, 22, and 23 provide embodiments with curvilinear channels 400. In the embodiments of FIGS. 21, 22, and 23, the curvilinear shape of the channels 400 may prolong the path of the channel 400 to decrease the reverse flow of slurry out of the retaining ring 60. FIGS. 21 and 22 illustrate channels having smoothly formed curvilinear shapes while FIG. 23 illustrates a channel formed stepwise by straight segments.

FIGS. 21, 22, and 23 are cross-sectional views taken along a horizontal plane through the channel and the portion 555 of the retaining ring and looking downward. In FIG. 21, the channel 400 extends from the opening 402 formed in the outer surface 302 to the opening 401 formed in the inner surface 301. As shown, the channel is formed with a curvature radius R3 and with a diameter D3. Further, the channel 400 makes an angle A2 of about 90 degrees with the outer surface 302.

In FIG. 22, the channel 400 extends from the opening 402 formed in the outer surface 302 to the opening 401 formed in the inner surface 301. As shown, the channel is formed with a curvature radius R4 and with a diameter D4.

The mean flow speed V of the slurry is represented by the equation:

$$V = \left(\frac{R}{d}\right)^{\frac{1}{2}} \left(\frac{\Delta P}{\rho}\right)^{\frac{1}{2}}$$

wherein R is the curvature radius, d is diameter, ΔP is pressure difference, and p is fluid density.

With the mean flow speed V fixed as the flow speed from the slurry supply arm 122 (FIG. 1), the channel diameter must decrease when the curvature radius decreases. In some embodiments, the curvature radius may be from 5 to 50 millimeters (mm). For example, the curvature radius may be at least 5, at least 10, at least 15, at least 20, at least 25, at least 30, at least 35, at least 40, or at least 45 millimeters (mm). Further, the curvature radius may be at most 10, at most 15, at most 20, at most 25, at most 30, at most 35, at most 40, at most 45, or at most 50 millimeters (mm). In some embodiments, the diameter may be from 2 to 20 millimeters (mm). For example, the diameter may be at least 2, at least 5, at least 10, or at least 15 millimeters (mm). Further, the curvature radius may be at most 5, at most 10, at most 15, or at most 20 millimeters (mm).

While FIGS. 21, 22, and 23 each illustrate a channel 400 having a configuration that is counterclockwise, it is contemplated that the channels may curve in the opposite, clockwise direction.

Provided herein are various embodiments of retaining rings 60 for CMP processes, which are provided with channels 400 that facilitate flow of slurry 99 into the retaining ring 60 while preventing or hindering flow of the slurry 99 out of the retaining ring 60. As a result, the CMP process may make more efficient use of the slurry 99.

Embodiments herein may provide such functionality by reducing the cross-sectional flow area of the channels 400 as they move from the outer surface 302 to the inner surface 301 of the retaining ring 60 by reducing the height, width, and/or radius of the channels 400. Alternatively or additionally, baffles 450 or 460 or other constrictions may be located in the channels 400 to obstruct reverse flow of slurry 99 out of the retaining ring 60, and to reduce the cross-sectional flow area of the channels 400. Alternatively or additionally, the channels may be formed with curvilinear paths to further reduce the reverse flow of the slurry 99 out of the retaining ring 60.

While various features are described in relation to the illustrated embodiments, it is contemplated that such features may be combined, despite such a combination not being expressly illustrated herein.

It is noted that the cross-section of the channels may change continuously, i.e., smoothly, or sharply, i.e., step-wise. Further, the cross-section may of any shape, such as circular, rectangular, square, triangular, or another suitable shape. Further, a single channel may have segments with different cross-sectional shapes.

Also, the baffles 450 and 460 may be provided with any suitable shape, and may be designed to extend into the channel from either sidewall or from the upper wall.

A chemical-mechanical polishing method includes engaging a polishing head 141 with a retaining ring 60. The retaining ring 60 is or includes an annular wall having an inner surface 301 and an outer surface 302, and a channel 400 extending from the outer surface 302 to the inner surface 301. The method further includes receiving a wafer 5 with the polishing head 141, such that the annular wall encircles the wafer 5. The method also includes holding the wafer 5 against a polishing pad 120. Also, the method includes rotating the polishing pad 120 about the axis 19 and/or rotating the polishing head 141 and retaining ring 60 about the axis 56. The method also includes distributing slurry 99 on the polishing pad 120 and facilitating entrance of slurry 99 into the internal volume 139 where the wafer 5 is located, while inhibit exit of slurry 99 from the internal volume 139 where the wafer 5 is located.

In one embodiment, a chemical-mechanical polishing apparatus includes a polishing pad; a polishing head configured to receive a wafer and to hold the wafer against the polishing pad; and a retaining ring configured to engage with the polishing head, wherein the retaining ring is formed with channels configured for flowing a slurry in a flow direction from outside the retaining ring to inside the retaining ring, wherein the channels have a cross-sectional flow area that decreases in the flow direction.

In some embodiments of the apparatus, each cross-sectional flow area decreases in the flow direction by 5% to 95%.

In some embodiments of the apparatus, each channel has a maximum cross-sectional flow area of from 5 to 500 square millimeters ($mm^2$).

In some embodiments of the apparatus, each channel has a length of from 0.5 to 50 millimeters (mm).

In some embodiments of the apparatus, for each channel, the cross-sectional flow area decreases continuously.

In some embodiments of the apparatus, for each channel, the cross-sectional flow area decreases step-wise.

In some embodiments of the apparatus, each channel includes a baffle for decreasing the cross-sectional flow area.

In some embodiments of the apparatus, each channel extends in a respective linear direction.

In some embodiments of the apparatus, each channel extends in a respective curvilinear direction.

In another embodiment, a retaining ring for encircling a wafer in a chemical-mechanical polishing apparatus includes an annular wall that encircles the wafer and has an outer surface and an inner surface; and a channel extending from the outer surface to the inner surface, wherein the channel has a first cross-sectional flow area adjacent the outer surface, wherein the channel has a second cross-sectional flow area adjacent the inner surface, and wherein the second cross-sectional flow area is less than the first cross-sectional flow area.

In some embodiments of the retaining ring, the second cross-sectional flow area is from 5% to 95% of the first cross-sectional flow area.

In some embodiments of the retaining ring, the first cross-sectional flow area is from 5 to 500 square millimeters ($mm^2$).

In some embodiments of the retaining ring, the channel has a length of from 0.5 to 50 millimeters (mm).

In some embodiments of the retaining ring, the channel includes a baffle for adjacent the inner surface.

In some embodiments of the retaining ring, the channel is linear.

In some embodiments of the retaining ring, the channel is curvilinear.

In another embodiment, a chemical-mechanical polishing method includes receiving a wafer with a polishing head; holding the wafer against a polishing pad; and engaging the polishing head with a retaining ring, wherein the retaining ring comprises: an annular wall encircling the wafer and having an outer surface and an inner surface; and a channel extending from the outer surface to the inner surface.

In some embodiments of the method, the channel has an inner channel wall formed with a curvature radius, wherein the curvature radius is from 5 to 50 millimeters (mm).

In some embodiments of the method, the channel is formed with a diameter, and wherein the diameter is from 2 to 20 millimeters (mm).

In some embodiments of the method, the channel makes an angle of about 90 degrees with the outer surface.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present.

What is claimed is:

1. A chemical-mechanical polishing apparatus, comprising:

a polishing pad;

a polishing head configured to receive a wafer and to hold the wafer against the polishing pad; and a retaining ring configured to engage with the polishing head, wherein the retaining ring is formed with channels configured for flowing a slurry in a flow direction from outside the retaining ring to inside the retaining ring, wherein at least one channel is defined by an inner wall of the retaining ring, wherein the at least one channel includes a first protrusion extending from the inner wall of the at least one channel into a flow path defined by the at least one channel, wherein the at least one channel includes a second protrusion extending from the inner wall of the at least one channel into the flow path, and wherein the first protrusion and the second protrusion are distanced from one another in the flow direction.

2. The chemical-mechanical polishing apparatus of claim 1, wherein the at least one channel has a cross-sectional flow area, and wherein the first protrusion reduces the cross-sectional flow area in the flow direction by 5% to 95%.

3. The chemical-mechanical polishing apparatus of claim 1, wherein each channel has a maximum cross-sectional flow area of from 5 to 500 square millimeters ($mm^2$).

4. The chemical-mechanical polishing apparatus of claim 1, wherein each channel has a length of from 0.5 to 50 millimeters (mm).

5. The chemical-mechanical polishing apparatus of claim 1, wherein for each channel, a cross-sectional flow area decreases step-wise.

6. The chemical-mechanical polishing apparatus of claim 1, wherein the first protrusion is a baffle for decreasing a cross-sectional flow area.

7. The chemical-mechanical polishing apparatus of claim 1, wherein each channel extends in a respective linear direction.

8. The chemical-mechanical polishing apparatus of claim 1, wherein each channel extends in a respective curvilinear direction.

9. The chemical-mechanical polishing apparatus of claim 1, wherein the flow path has an upstream cross-sectional flow area immediately upstream of the first protrusion and a downstream cross-sectional flow area immediately downstream of the first protrusion, and wherein the upstream cross-sectional flow area and the downstream cross-sectional flow area are equal.

10. A chemical-mechanical polishing apparatus, comprising:

a polishing pad;

a polishing head configured to receive a wafer and to hold the wafer against the polishing pad; and a retaining ring configured to engage with the polishing head, wherein the retaining ring comprises:

an annular wall having an outer surface and an inner surface; and a channel extending from the outer surface to the inner surface, wherein the channel includes baffles positioned within the channel to reduce a cross-sectional flow area of the channel, wherein the baffles are arranged periodically along a length of the channel.

11. The chemical-mechanical polishing apparatus of claim 10, wherein the baffles are mounted to an upper wall of the channel.

12. The chemical-mechanical polishing apparatus of claim 10, wherein the baffles are mounted at an angle of from 1 to 90 degrees relative to an upper wall of the channel.

13. The chemical-mechanical polishing apparatus of claim 10, wherein the baffles have a cross-sectional area of from 1 to 50% of the cross-sectional flow area of the channel.

14. The chemical-mechanical polishing apparatus of claim 10, further comprising side baffles mounted to opposite sidewalls of the channel.

15. The chemical-mechanical polishing apparatus of claim 14, wherein the side baffles are located at an inner opening of the channel adjacent the inner surface.

16. A chemical-mechanical polishing apparatus, comprising:

a polishing pad;

a polishing head configured to receive a wafer and to hold the wafer against the polishing pad; and a retaining ring configured to engage with the polishing head, wherein the retaining ring comprises:

an annular wall encircling the wafer and having an outer surface and an inner surface; and a channel extending from the outer surface to the inner surface, wherein the channel extends in a curvilinear direction, wherein the channel is defined by an inner wall of the retaining ring, wherein the channel includes a protrusion extending from the inner wall of the channel into a flow path defined by the channel, wherein the flow path has an upstream cross-sectional flow area immediately upstream of the protrusion and a downstream cross-sectional flow area immediately downstream of the protrusion, and wherein the upstream cross-sectional flow area and the downstream cross-sectional flow area are equal.

17. The chemical-mechanical polishing apparatus of claim 16, wherein the protrusion is a first protrusion, and wherein the channel includes a second protrusion extending from the inner wall of the channel into the flow path, wherein the first protrusion and the second protrusion are distanced from one another in a flow direction.

18. The chemical-mechanical polishing apparatus of claim 16, wherein the protrusion forms an angle with the inner wall, and wherein the angle is from 1 to 90 degrees.

19. The chemical-mechanical polishing apparatus of claim 16, wherein the inner wall of the retaining ring includes a first sidewall surface, a second sidewall surface, and an upper wall surface interconnecting the first sidewall surface and the second sidewall surface, and wherein the protrusion connects to only one of the first sidewall surface, the second sidewall surface, and the upper wall surface.

* * * * *